(12) United States Patent
Chen et al.

(10) Patent No.: US 9,577,634 B2
(45) Date of Patent: Feb. 21, 2017

(54) SCALABLE CROSSBAR APPARATUS AND METHOD FOR ARRANGING CROSSBAR CIRCUITS

(71) Applicant: Intel Corporation, Santa Clara, CA (US)

(72) Inventors: Gregory K. Chen, Hillsboro, OR (US); Mark A. Anders, Hillsboro, OR (US); Himanshu Kaul, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/751,060

(22) Filed: Jun. 25, 2015

(65) Prior Publication Data

US 2016/0380629 A1 Dec. 29, 2016

(51) Int. Cl.
*H03K 19/173* (2006.01)
*H03K 19/00* (2006.01)
*H03K 19/177* (2006.01)

(52) U.S. Cl.
CPC .... *H03K 19/0008* (2013.01); *H03K 19/17704* (2013.01); *H03K 19/17744* (2013.01)

(58) Field of Classification Search
CPC .............. H03K 19/0008; H03K 19/17704; H03K 19/07744; H04L 12/6402
USPC ............... 326/38, 41, 47; 370/353, 357, 386
See application file for complete search history.

(56) References Cited

U.S. PATENT DOCUMENTS

| | | | |
|---|---|---|---|
| 7,394,288 B1 * | 7/2008 | Agarwal | G06F 15/7867 326/39 |
| 2006/0104267 A1 | 5/2006 | Mondinelli et al. | |
| 2013/0188486 A1 | 7/2013 | Thacker et al. | |
| 2015/0063348 A1 | 3/2015 | Chrysos et al. | |
| 2015/0071282 A1 * | 3/2015 | Anders | H04L 12/6418 370/353 |
| 2015/0092792 A1 | 4/2015 | Shen | |

FOREIGN PATENT DOCUMENTS

WO 2015038120 3/2015

OTHER PUBLICATIONS

Kolodny, "Networks on Chips (NoC)—Keeping up with Rent's Rule and Moore's Law" Technion—Israel Institute of Technology; International Workshop on System Level Interconnect Prediction (SLIP) Mar. 2007 (55 pages) http://www.sliponline.org/SLIP07/presentations/4A_Kolodny.pdf.

Kolodny, "Networks on Chips: A New Paradigm" NOC Paradigm Tutorial, 2009 (7 pages) http://circuit.ucsd.edu/~nocs2009/talks/Technion%20NOC%20Tutorial%20Part%20One.pdf.

Ginosar, "Networks on Chip (NOC)" Technion-Israel Institute of Technology, 2009 (35 pages) https://amstel.estec.esa.int/tecedm/NoC_workshop/GinosarNOC_Tutorial.pdf.

(Continued)

*Primary Examiner* — Daniel D Chang
(74) *Attorney, Agent, or Firm* — Green, Howard, & Mughal, LLP (57) ABSTRACT

Described is an apparatus (e.g., a router) which comprises: multiple ports; and a plurality of crossbar circuits arranged such that at least one crossbar circuit receives all interconnects associated with a data bit of the multiple ports and is operable to re-route signals on those interconnects.

18 Claims, 9 Drawing Sheets

(56) References Cited

OTHER PUBLICATIONS

Stojanović, "Design of Energy-Efficient On-Chip Networks" Integrated Systems Group, MIT, ISSCC 2010 Tutorial (93 pages) http://www.rle.mit.edu/isg/documents/2010_NOC_tutorial_vladimir.pdf.

Lee et al., "A 256-Radix Crossbar Switch Using Mux-Matrix-Mux Folded-Clos Topology"; Journal of Semiconductor Technology and Science, vol. 14, No. 6, Dec. 2014; http://dx.doi.org110.5573/JSTS.2014.14.6.760 J (8 pages).

Chen et al., "Network-on-Chip (NoC) Topologies and Performance: A Review"; PKP Open Conference Systems, Presented by IEEE Newfoundland and Labrador Section, Last modified: Oct. 18, 2011, Found at: http://necec.engr.mun.ca/ocs2011/viewpaper.php?id=41 (6 pages).

Chen et al., "A 340 mV-to-0.9 V 20.2 Tb/s Source-Synchronous Hybrid Packet/Circuit-Switched 16 × 16 Network-on-Chip in 22 nm Tri-Gate CMOS", IEEE Journal of Solid-State Circuits, vol. 50, No. 1, Jan. 2015, pp. 59-67 (9 pages).

International Search Report and Written Opinion for International Patent Application No. PCT/US2016/033648, mailed on Aug. 24, 2016, 12 pages.

\* cited by examiner

SCALABLE CROSSBAR APPARATUS AND METHOD FOR ARRANGING CROSSBAR CIRCUITS

BACKGROUND

Crossbar circuits (which are also referred to as crossbar switches, cross-point switches, matrix switches, coordinate switching circuits, crossbars, routers, etc.) are a collection of switches or multiplexers which are typically arranged in a matrix configuration. A crossbar switch has multiple input and output lines that form a crossed pattern of interconnecting lines between which a connection may be established by closing a switch located at each intersection.

For example, if the crossbar switch has 'M' input lines and 'N' output lines, then the crossbar/router has a matrix with M×N cross-points or places where the connections cross. At each cross-point is a crossbar switch, and when the switch is closed, the switch connects one of the input lines to one of the output lines. Typically, concurrent connections in the crossbar switches do not prevent connecting other input lines to other output lines.

Energy-efficient, high-performance crossbar circuits are used for efficient on-chip communication. On-chip communication limits processor performance and power, and is becoming increasingly crucial because of process scaling and core-count increases, where core-count are count of processing elements (e.g., cores, caches, memory controllers, etc.). Crossbars enable data exchange among a set of ports having input and output lines. Crossbars may directly connect processing elements to each other in a full crossbar. Or, crossbars may be networked to relay data between cores using a series of router switches.

For high throughput, many crossbar switches rely on wide data busses. Here, data bus width is indicated by 'd' (i.e., number of bits), and crossbar radix is indicated by 'p' (i.e., number of ports). As 'd' increases, the physical dimension of the entire crossbar grows, which increases the interconnection lengths for each data bit (i.e., propagation delay increases). As 'p' increases, data must be broadcast to more distant locations in the crossbar (i.e., more drivers are needed and thus more power is consumed). For lower latency in a Network-on-Chip (NoC), crossbar switches should accommodate higher radices (i.e., higher values for 'p'). However, traditional crossbar design techniques and associated floorplans exhibit limited scalability in terms of 'd' and 'p.' For example, propagation delay and power consumption for traditional crossbars scale quadratically with respect to both data bus width and the number of ports. This leads to performance and power degradation for a NoC.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Some embodiments describe an apparatus which comprises multiple ports and a plurality of crossbar circuits arranged such that at least one crossbar circuit receives all interconnects associated with a data bit (i.e., one data bit) of the multiple ports and is operable to re-route signals on those interconnects. Compared to traditional crossbar floor planning, crossbar floor planning of some embodiments is adjusted to limit data broadcasting and local interconnect length in the crossbar. In some embodiments, circuits for an individual data bit from each of the 'p' radix crossbar ports are physically aggregated to form a radix-p 1-bit crossbar circuit. These 1-bit crossbar circuits (or crossbars) are arrayed for each data bit in the d-bit bus to form the complete radix-p d-bit crossbar, in accordance with some embodiments.

There are many technical effects of various embodiments. For example, the crossbar circuits of some embodiments reduce local interconnect length by eliminating long-distance data broadcast within the router. This also improves the performance and power scalability with crossbar radix (p) and bus width (d). For example, the power consumption and propagation delay for crossbars of various embodiments scales linearly. This leads to performance and power improvement for a Network-on-Chip (NoC). Other technical effects will be evident from the various embodiments described here.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure.

Figure 1:
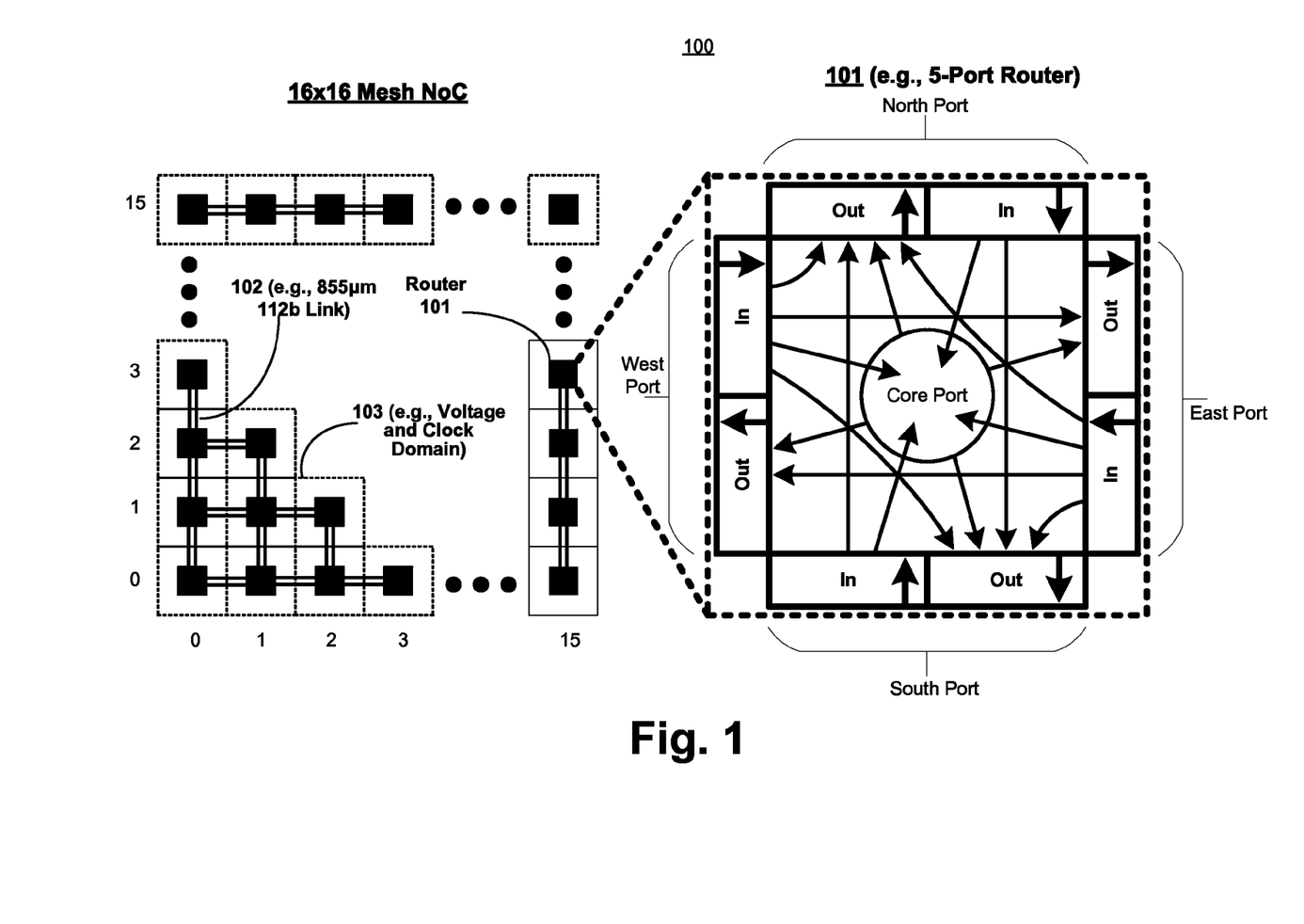
FIG. 1 illustrates a Network-on-Chip (NoC) with routers having a scalable floorplan, according to some embodiments of the disclosure.

FIG. 1 illustrates NoC 100 with routers having a scalable layout floorplan, according to some embodiments of the disclosure. In some embodiments, NoC 100 comprises a network of Routers 101 coupled together via links 102 (e.g., 855 μm long 112-bit link), where each router of Routers 101 has a scalable layout floorplan. In some embodiments, NoC 100 forms a routing network for processing elements 103 (e.g., intellectual property (IP) cores such as processors, memories, graphic units, etc.) in an integrated circuit (IC) or a computer system.

Here, the term "layout floorplan" generally refers to a representation of placement of electrical components, such as circuits, wires, ports, in an area of an integrated circuit (IC). The term "scalable layout floorplan" generally refers to the ability to increase or decrease, relative to one or more performance parameters (such as propagation delay, power, etc.), the x/y dimension(s) of the layout floorplan and/or the ability to increase or decrease, relative to one or more performance parameters, a number of electrical components associated with the IC. For example, increasing the number of radix crossbar ports 'p' and/or the width of data bus 'd' associated with the ports increases the interconnect power consumption of the crossbar linearly, which means the interconnect power consumption associated with the crossbar layout floorplan scales linearly with increase in 'p' and/or 'd.'

ICs have traditionally used point-to-point interconnects where one wire is dedicated to a signal. Such traditional interconnections (and others such as shared buses or segmented buses with bridges) are not efficient with reference to one or more performance parameters such as power consumption and signal propagation speed, especially for large IC designs. On-chip communication is a performance and power limiter for multi-core processors. To enable communication between processing elements (such as processing elements 103), high performance, energy-efficient crossbar circuits are desired. NoCs can alleviate such physical limitations of traditional interconnections by providing wires in links that are shared by many signals. As such, a high level of parallelism is achieved with higher throughput and scalability. In some embodiments, all links 102 in NoC 100 can operate via Routers 101 simultaneously on different data packets.

In some embodiments, NoC 100 can span synchronous and asynchronous clock domains. For example, some processing elements 103 may generate synchronous output signals while some processing elements 103 may generate asynchronous signals, both of which can be exchanged between various processing elements via NoC 100. In some embodiments, NoC 100 manages the synchronization of data signals over links 102 by clocking the data output of the multiplexers of the crossbar circuits. In some embodiments, NoC 100 design is asynchronous which allows for power savings when the links 102 are idle (i.e., signals on the links are not toggling) and/or Router 101 is idle.

In some embodiments, NoC 100 relays data between processing elements 103 using a mesh of Routers 101 and associated wires/links 102. Here, the topology of NoC is illustrated as a mesh topology. However, the embodiments are not limited to mesh topologies. For example, topologies such as ring, star, tree, fat tree, butterfly, torus, etc. can be used for NoC 100. In some embodiments, topologies of NoC 100 can be designed to reduce latency and provide greater connectivity. For example, NoC 100 may use wide data busses (e.g., 512 bits to 1024 bits) for its ports to improve network throughput. A zoomed version of one possible Router 101 is shown on the right side of FIG. 1.

In this example, a 5-port Router is shown. However, the embodiments are not limited to 5-port routers. For example, various embodiments are applicable for S-port, 4-port, 6-port, etc. routers. Continuing with the example of 5-port Router 101, in some embodiments, 5-port Router 101 comprises five ports—South Port, North Port, East Port, West Port, and Core Port. Each port includes wires (e.g., 112 bits, 512 bits, 1024 bits, etc.) for input and output.

The term "port" here generally refers to a hardware port. This hardware port is not pure software. The hardware port may comprise a wire interface for supporting a number of bits for input and/or output. For example, the wire interface may support 112 bits, 512 bits, 1024 bits, etc. for input and output. In some embodiments, the hardware port comprises more than a wire interface for information signals. For example, the wire interface may include interface for power and/or ground lines. The hardware port, if appropriate, may also include more than just a wire interface.

In some embodiments, North, South, East, and West Ports are used to communicate with other routers of NoC 101 and with its own ports. In some embodiments, Core Port is used to communicate with local logic (e.g., processing element 103 in close proximity to Core Port) and with the North, South, East, and West Ports. The network of wires shown in the center of 5-port Router 101 are managed or multiplexed by crossbar circuits (within Router 101) which are arranged in a scalable floorplan, according to some embodiments.

In some embodiments, the crossbar circuit comprises one or more multiplexers (e.g., 2:1, 4:1, 8:1, etc. multiplexers) which are arranged such that signals on the interconnects extending in the x-direction are routed before signals on the interconnects extending in the y-direction. Such routing is referred to as x-first and y-second routing. One technical effect of such routing is to avoid deadlocks in data proparation. In some embodiments, the crossbar circuit comprises one or more multiplexers which are fully connected. A fully connected crossbar may have connections from all inputs to all outputs. Router 101 is not fully connected because, for example, in the x-first and y-second routing there are no connections from a north/south port to an east/west port.

Figure 2:
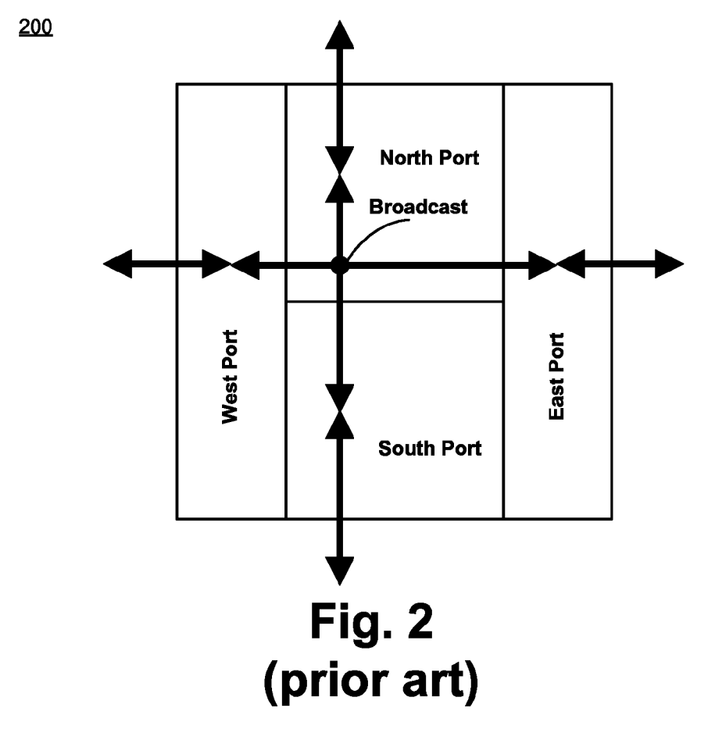
FIG. 2 illustrates a traditional floorplan of a crossbar circuit with separated ports.

FIG. 2 illustrates traditional floorplan 200 of a crossbar circuit with separated ports. Traditional crossbar designs use floorplans such as floorplan 200 with separate port circuits. Floorplan 200 requires that each data bit is broadcast among the distant router ports. This creates scaling problems as crossbar radix 'p' and data bus width 'd' increase. As 'p' increases, data must be broadcast to more distant locations in the crossbar. As 'd.' increases, the physical dimension of the entire crossbar grows, increasing interconnection lengths for each data bit. Considering wire delay only, traditional floorplan 200 causes latency without repeater insertion to scale as $O(n^2)$ with both 'd.' and 'p.' Wire length and energy/bit scale as $O(n)$. As such, latency with unrepeated interconnect scales $O(n^2)$ with wire length. As an example, doubling both the radix and bus width leads to a 16× degradation in crossbar data latency using traditional floorplan 200. These deficiencies are mitigated with the floorplans described with reference to FIGS. 3-4, in accordance with some embodiments.

Figure 3A:
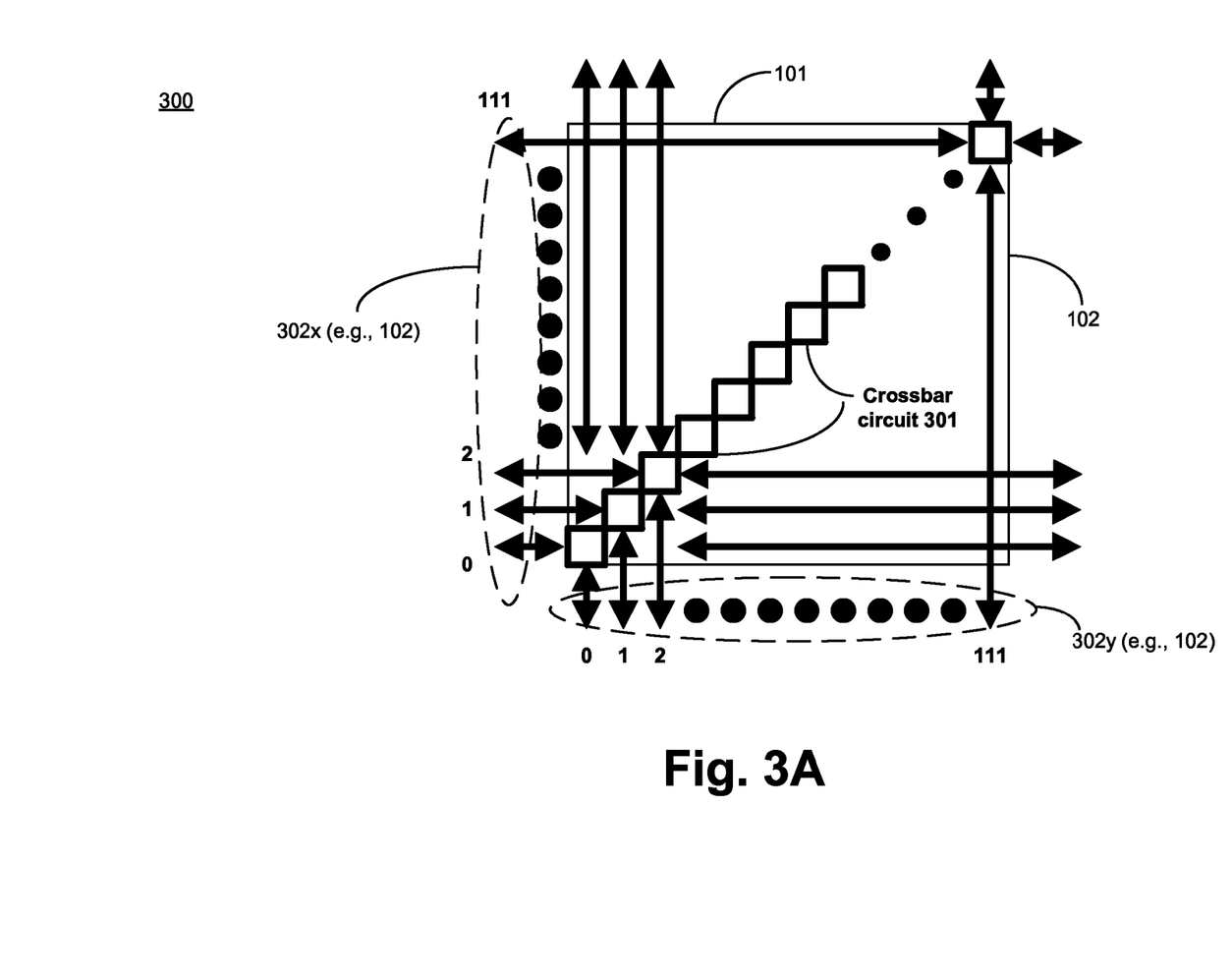
FIG. 3A illustrates a floorplan of a crossbar circuit exhibiting linear scaling, according to some embodiments of the disclosure.

FIG. 3A illustrates floorplan 300 of a crossbar circuit exhibiting linear scaling, according to some embodiments of the disclosure. It is pointed out that those elements of FIG. 3A having the same reference numbers (or names) as the elements of any other figure can operate or function in any manner similar to that described, but are not limited to such.

In some embodiments, crossbar circuits in Router 101 are aggregated as crossbar circuits 301 for individual data bits from each of the 'p' crossbar ports. Each of the crossbar circuits 301 is a 1-bit crossbar circuit, in accordance with some embodiments. In some embodiments, crossbar circuits 301 are arrayed for each data bit in the d-bit bus to form the complete radix-p d-bit crossbar (i.e., Router 101). In some embodiments, crossbar circuits 301 are arranged in a diagonal array to form Router 101. In one such example, if the distance between the 1-bit crossbar circuits 301 in neighboring NoC Routers 101 remained unchanged, and considering wiring delay only, router performance is independent of both 'p' and 'd.' In some embodiments, the circuit complexity (i.e., complexity of multiplexers and/or associated circuits in 1-bit crossbar circuit 301) and latency of crossbar circuits 301 increases with 'p' but is independent of 'd.'

In some embodiments, interconnects 302*x* and 302*y* of the multiple ports (East, West, South, North Ports) are arranged sequentially (e.g., wires 1 to 111 for a 112-bit data bus) along the edges (e.g., east edge, west edge, south edge, and north edge) of Router 101. In some embodiments, each crossbar circuit 301 comprises one or more multiplexers which are arranged such that signals on interconnects 302*x* (e.g., 102) extending in the x-direction are routed before signals on interconnects 302*y* (e.g., 102) extending in the y-direction (i.e., x-first and y-second routing). In some embodiments, crossbar circuit 301 comprises one or more multiplexers which are fully connected. In some embodiments, data are broadcast between multiplexer circuits (not shown) within 1-bit crossbar circuit 301.

In some embodiments, select signals (not shown) on a select bus are broadcast to all multiplexers of 1-bit crossbar circuits 301. In some embodiments, at least one multiplexer of the plurality of multiplexers in each of the crossbar circuits shares a same select bus. In some embodiments, the select bus controls one multiplexer within each 1-bit crossbar circuit 301. In some embodiments, for each multiplexer within 1-bit crossbar circuit 301 there are different selects (or select buses). In some embodiments, for the same multiplexer (e.g., an East Port multiplexer) in all of 1-bit crossbar circuits 301, the same select bus is shared.

In some embodiments, clock signals are also broadcast to all 1-bit crossbar circuits 301. For example, the outputs of each multiplexer may be synchronized with reference to an edge of the clock signal(s). In some embodiments, the outputs of the multiplexers are asynchronous. In various embodiments, the number of control signals is low compared to the number of data bits. As such, there is a minimal power impact, if any, to the various embodiments. In some embodiments, the propagation delay through crossbar circuits 301 is masked by allowing control signal propagation to occur in parallel to the data link traversal delay. The propagation delay of the control signals can be hidden as they propagate to their multiplexer selects within the crossbar while the data is traversing a link between two crossbars. When the data arrives at the crossbar, the control signals (either multiplexer select signals or clock signal) will already be ready, in accordance with some embodiments.

FIGS. 3B-F illustrate floorplans 320, 330, 340, 350, and 360 of crossbar circuits exhibiting linear scaling, according to some other embodiments of the disclosure. It is pointed out that those elements of FIGS. 3B-F having the same reference numbers (or names) as the elements of any other figure can operate or function in any manner similar to that described, but are not limited to such.

Figure 3B:
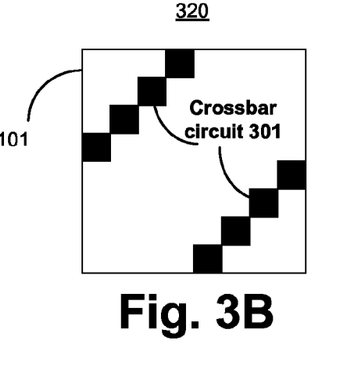
FIGS. 3B-F illustrate floorplans of crossbar circuits exhibiting linear scaling, according to some other embodiments of the disclosure.

Referring with reference to FIG. 3B, in some embodiments, crossbar circuits in Router 101/320 are aggregated as crossbar circuits 301 for individual data bits from each of the 'p' crossbar ports. Each of the crossbar circuits 301 is a 1-bit crossbar circuit, in accordance with some embodiments. In some embodiments, crossbar circuits 301 are arrayed for each data bit in the d-bit bus to form the complete radix-p d-bit crossbar (i.e., Router 101/320).

In some embodiments, crossbar circuits 301 are arranged in two diagonal arrays of equal number of crossbar circuits 301 to form Router 101/320. In some embodiments, the two diagonal arrays of equal number of crossbar circuits 301 together are arrayed for each data bit in the d-bit bus to form the complete radix-p d-bit crossbar (i.e., Router 101/320). In some embodiments, the slopes of the two diagonal arrays are the same (e.g., both are positive slopes). Here, each crossbar circuit 301 in a diagonal is accessible by the subsequent sequential port in the x and y directions (i.e., 302*x* and 302*y*) with fixed offset. For example, the bottom diagonal is accessible by subsequent sequential ports in the x and y directions with an offset (e.g., 4) in the x-direction. Continuing with the example, the top diagonal is accessible by the subsequent sequential ports in the x and y directions with an offset (e.g., 4) in the y-direction.

Figure 3C:
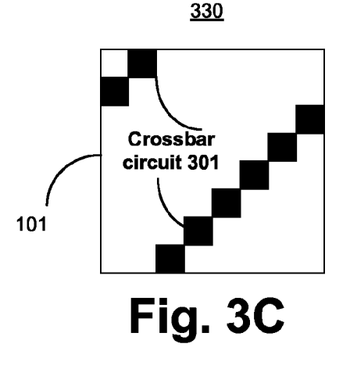

Referring with reference to FIG. 3C, in some embodiments, crossbar circuits 301 are arranged in two diagonal arrays of unequal number of crossbar circuits 301 to form Router 101/330. In some embodiments, the slopes of the two diagonal arrays are the same (e.g., both slopes are either positive or negative). In some embodiments, the two diagonal arrays of unequal number of crossbar circuits 301 together are arrayed for each data bit in the d-bit bus to form the complete radix-p d-bit crossbar (i.e., Router 101/330). Here, each crossbar circuit 301 in a diagonal is accessible by the subsequent sequential ports in the x and y directions.

For example, the first two crossbar circuits of the top diagonal array are accessible by the first two ports in the x direction and the last two ports (i.e., p-2) in the y-direction. Continuing with the example, the six crossbar circuits of the bottom diagonal array are accessible by the third and onwards ports in the x direction and the first p-2 ports in the y-direction, in accordance with some embodiments.

Figure 3D:
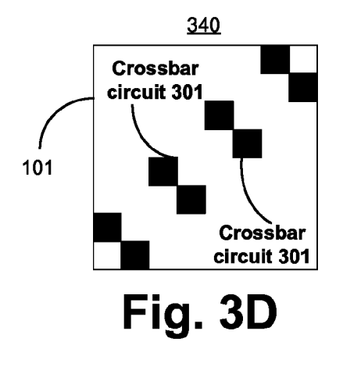

Referring with reference to FIG. 3D, in some embodiments, crossbar circuits 301 are arranged in two diagonal arrays of equal number of crossbar circuits 301 to form Router 101/340. In some embodiments, the slopes of the two diagonal arrays are the same. In some embodiments, the two diagonal arrays of equal number of crossbar circuits 301 together are arrayed for each data bit in the d-bit bus to form the complete radix-p d-bit crossbar (i.e., Router 101/340). In some embodiments, each crossbar circuit 301 in the bottom diagonal is accessible by every other subsequent sequential ports in the x direction with an offset (e.g., 1) and every other sequential port in the y direction. In some embodiments, each crossbar circuit 301 in the top diagonal is accessible by every other subsequent sequential ports in the x direction and every other sequential port with an offset (e.g., one) in the y direction.

Figure 3E:
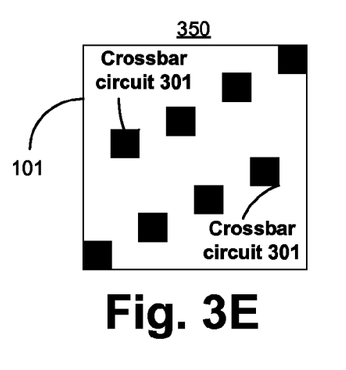

Referring with reference to FIG. 3E, in some embodiments, crossbar circuits 301 are arranged in two diagonal arrays of equal number of crossbar circuits 301 to form Router 101/350. In some embodiments, the slopes of the two diagonal arrays are the same. In some embodiments, the two diagonal arrays of equal number of crossbar circuits 301 together are arrayed for each data bit in the d-bit bus to form the complete radix-p d-bit crossbar (i.e., Router 101/350). In some embodiments, each crossbar circuit 301 in the bottom diagonal is accessible by every other subsequent sequential port in the x and y directions. In some embodiments, each crossbar circuit 301 in the top diagonal is accessible by every other subsequent sequential port with a fixed offset (e.g., four) in the y direction and by every other subsequent sequential port in the x direction.

Figure 3F:
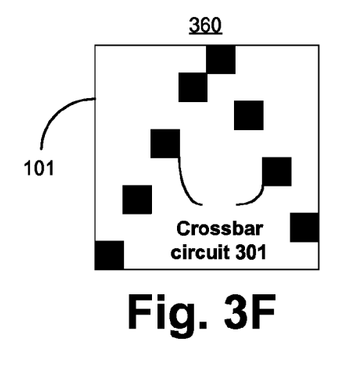

Referring with reference to FIG. 3F, in some embodiments, crossbar circuits 301 are arranged in two diagonal arrays of equal number of crossbar circuits 301 to form Router 101/360. In some embodiments, the two diagonal arrays of equal number of crossbar circuits 301 together are arrayed for each data bit in the d-bit bus to form the complete radix-p d-bit crossbar (i.e., Router 101/360). In some embodiments, the slope of one of the diagonal arrays is positive while the slope of the other diagonal array is negative.

Figure 4:
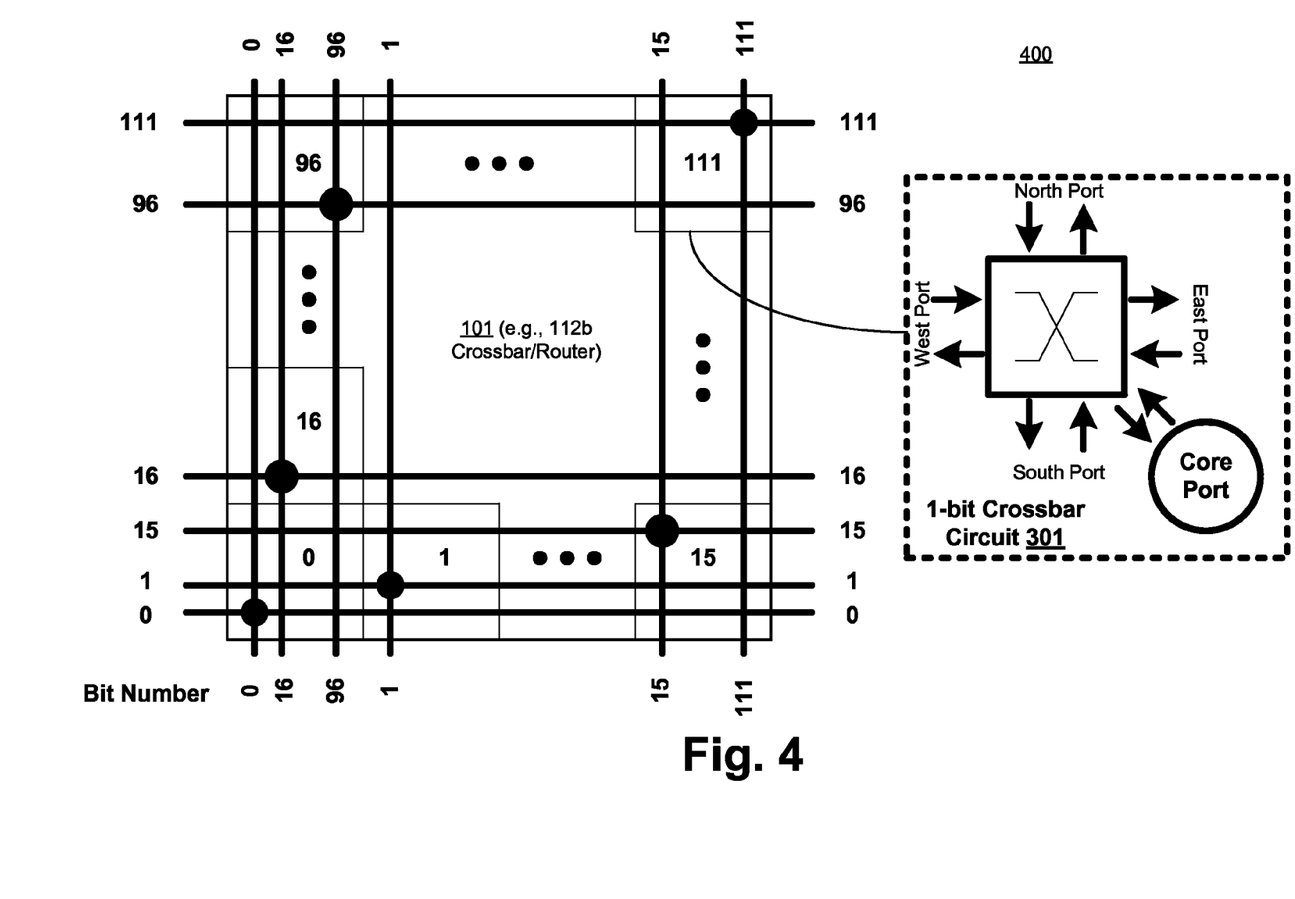
FIG. 4 illustrates a floorplan of a crossbar circuit exhibiting linear scaling, according to some other embodiments of the disclosure.

FIG. 4 illustrates floorplan 400 of a crossbar circuit exhibiting linear scaling, according to some other embodiments of the disclosure. It is pointed out that those elements of FIG. 4 having the same reference numbers (or names) as the elements of any other figure can operate or function in any manner similar to that described, but are not limited to such.

Floorplan 400 is one variation of floorplan 300, according to some embodiments. Other variations of floorplan 300 are also possible as shown with reference to FIGS. 3B-F.

Referring back to FIG. 4, in one case, 1-bit crossbar circuit 301 may be too large to fit into floorplan 300. In such a case, 1-bit crossbar circuits 301 are tiled in a two-dimensional (2D) array, according to some embodiments. Here, 1-bit crossbar circuits 301 are illustrated as dotted boxed sections. The shaded and dark circles inside the dotted boxed sections indicate the intersection of interconnects (i.e., where the crossbar circuit is positioned).

In some embodiments, the plurality of crossbar circuits 301 are arranged such that data bits (e.g., shaded and black horizontal lines 0 to 111) of the multiple ports are arranged sequentially in one direction and arranged in strides of a number of data bits in another direction. For example, data bits are arranged sequentially in the y-direction and arranged with a stride of 16 in the x-direction. Like floorplan 300, all wires (i.e., interconnects) of floorplan 400 for a given bit are centralized in one location, in accordance with some embodiments. As such, power and delay scale linearly for floorplan 400.

Figure 5:
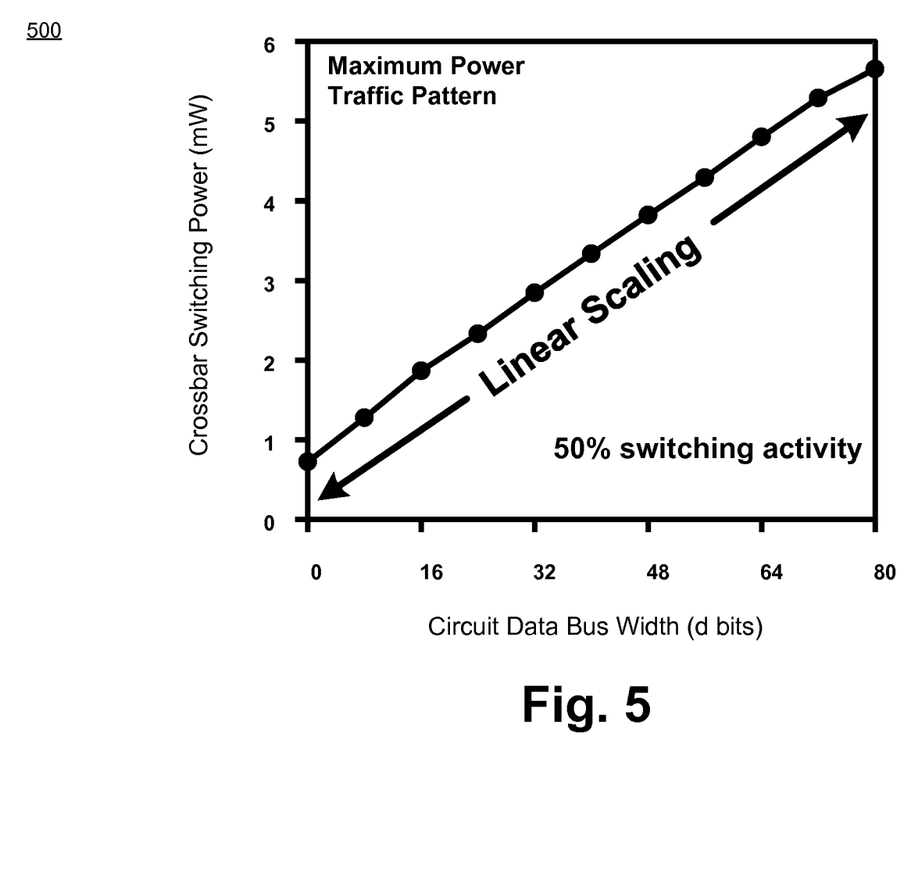
FIG. 5 illustrates a plot showing linear power scaling of the crossbar circuit, according to some embodiments of the disclosure.

FIG. 5 illustrates plot 500 showing linear power scaling of the crossbar circuit, according to some embodiments of the disclosure. It is pointed out that those elements of FIG. 5 having the same reference numbers (or names) as the elements of any other figure can operate or function in any manner similar to that described, but are not limited to such. Here, x-axis is circuit data bus width in bits (i.e., d-bits) while y-axis is crossbar switching power in milli-watts (mW). Plot 500 shows that as the number of d-bits increase, power consumption increases linearly. Conversely, as the number of d-bits increase for traditional crossbars (i.e., routers), such as router 200 of FIG. 2, power of the router scales by $O(n^2)$ with wire length (e.g., doubling the radix 'p' and bus width 'd' leads to a 16× degradation in crossbar data latency for such router 200).

Figure 6:
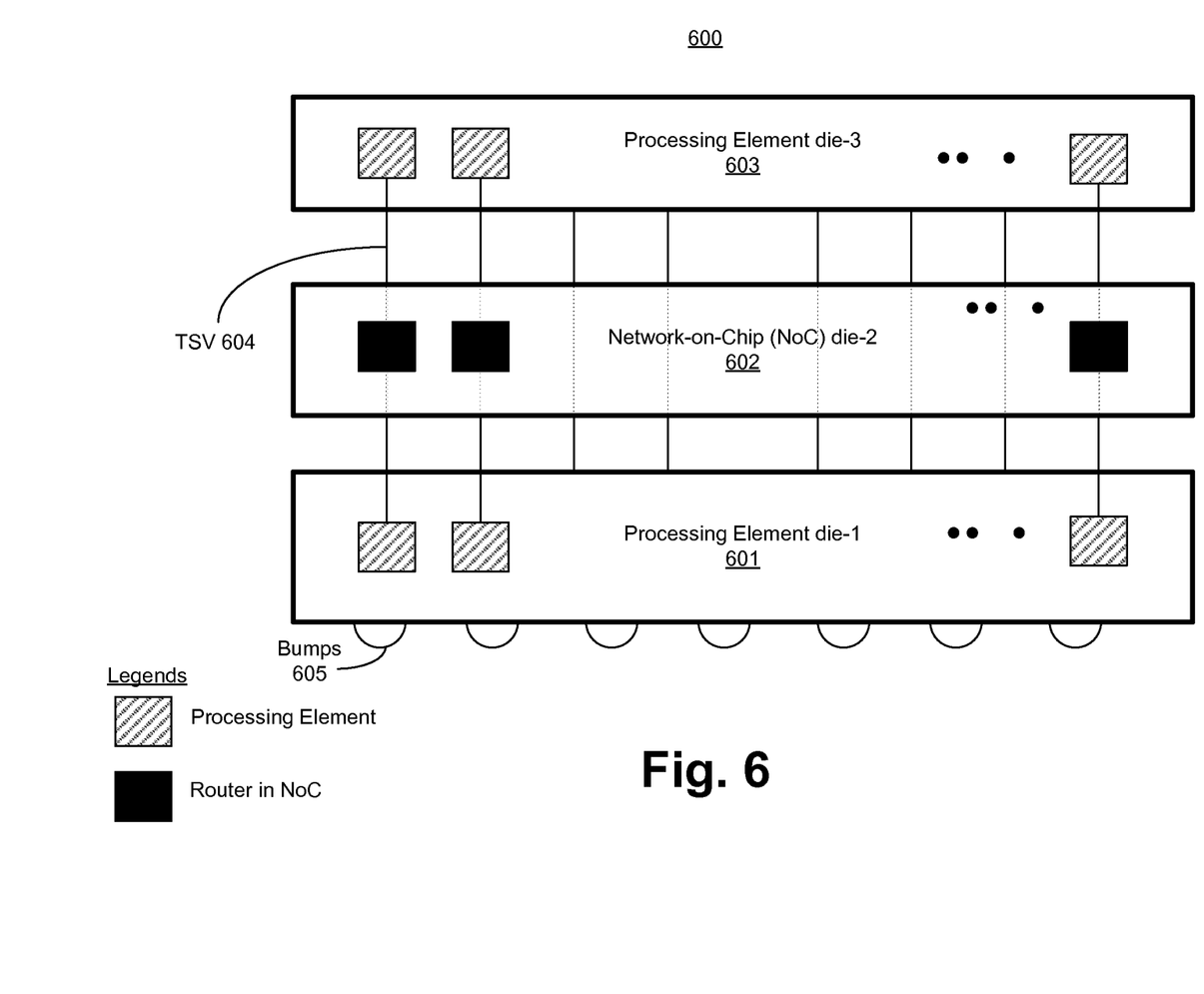
FIG. 6 illustrates a three-dimensional (3D) integrated circuit (IC) with a NoC having a scalable floorplan, according to some embodiments of the disclosure.

FIG. 6 illustrates a three-dimensional (3D) integrated circuit (IC) 600 with a NoC having a scalable crossbar floorplan, according to some embodiments of the disclosure. It is pointed out that those elements of FIG. 6 having the same reference numbers (or names) as the elements of any other figure can operate or function in any manner similar to that described, but are not limited to such.

In some embodiments, multiple dies are stacked on top of each other and electrically coupled through special vertical interconnects (e.g., through-silicon-vias (TSVs)) such that NoC 100 provides communication hubs for other dies. In this example, three dies are illustrated. However, any number of dies can be stacked as allowed by the process technology. In some embodiments, IC 600 comprises Processing Element die-1 601, NoC die-2 602, Processing Element die-3 603, TSVs 604, and Bumps 605.

Here, Processing Elements can be any type of processing elements. For example, Processing Elements may be processing cores, caches, voltage regulators, memories, graphic engines, signal processors, etc. In some embodiments, NoC die-2 has a plurality of Routers 101 which are dispersed in an array or any other topology (e.g., mesh, ring, star, tree, fat tree, butterfly, torus, etc.) to route wires from Processing Element Die-1 601 to Processing Element die-3 603. In this example, each Processing Element die is illustrated with a plurality of Processing Elements (in patterned boxes) while NoC die-2 602 includes a plurality of routers (shown as shaded boxes). In some embodiments, TSVs 604 electrically couple one die to another die and to Bumps 605. For example, TSVs 603 couple the routers with the Processing Elements between dies. In some embodiments, Bumps 605 couple to a package (not shown).

Figure 7:
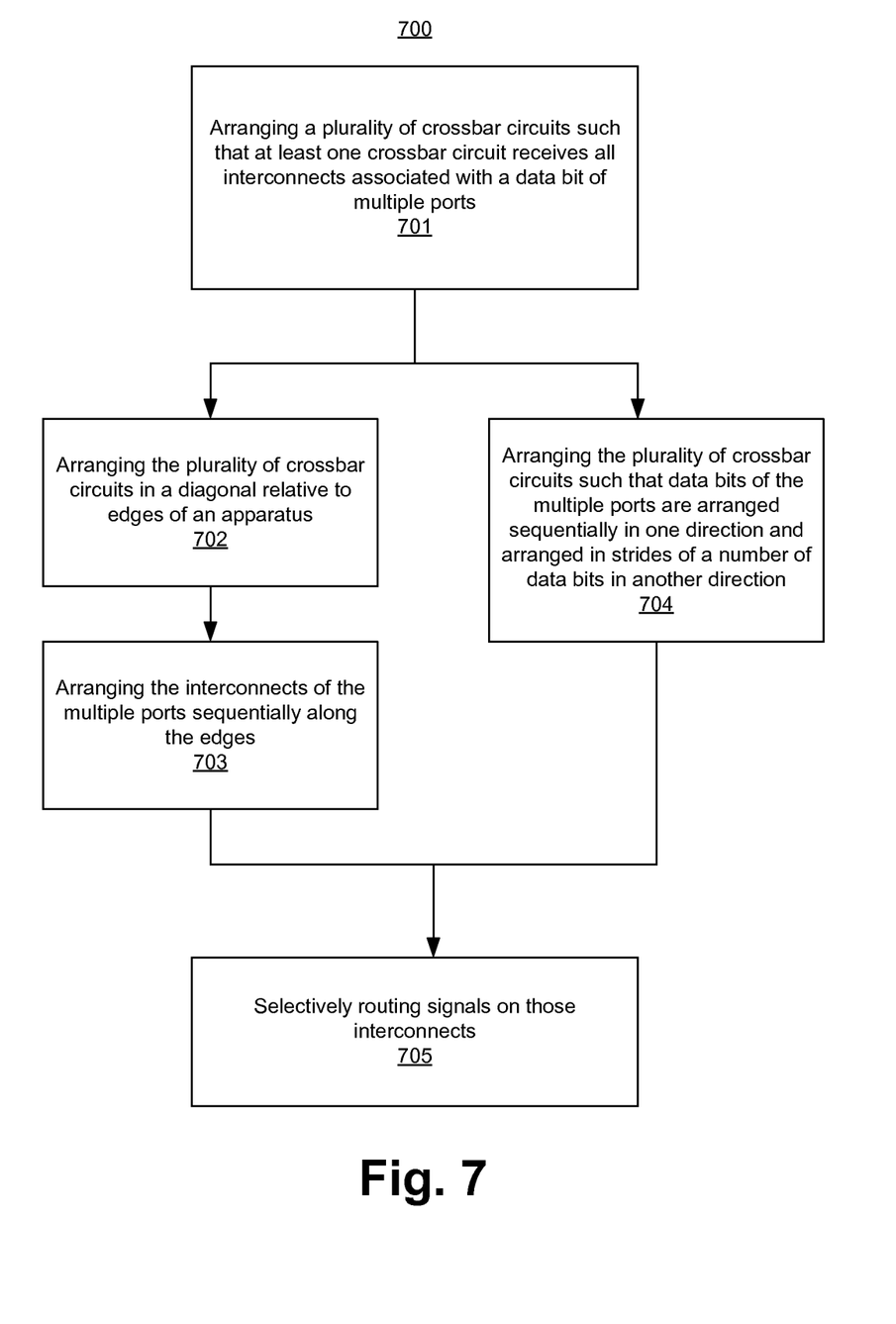
FIG. 7 illustrates a flowchart of a method for laying out the scalable floorplan, according to some embodiments of the disclosure.

FIG. 7 illustrates flowchart 700 of a method for laying out the scalable crossbar floorplan, according to some embodiments of the disclosure. It is pointed out that those elements of FIG. 7 having the same reference numbers (or names) as the elements of any other figure can operate or function in any manner similar to that described, but are not limited to such.

Although the blocks in the flowchart with reference to FIG. 7 are shown in a particular order, the order of the actions can be modified. Thus, the illustrated embodiments can be performed in a different order, and some actions/blocks may be performed in parallel. Some of the blocks and/or operations listed in FIG. 7 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 701, a plurality of crossbar circuits 301 are arranged (e.g., on a die having processing elements or separate die(s) as discussed with reference to FIG. 6) such that at least one crossbar circuit receives all interconnects associated with a data bit of multiple ports. In some embodiments, crossbar circuits 301 are arranged in a diagonal array as described with reference to FIG. 3A. In other embodiments, crossbar circuits 301 are arranged in other patterns such as those described with reference to FIGS. 3C-F. Referring back to FIG. 7, in one such example, processes 702 and 703 are executed. In some embodiments, crossbar circuits 301 are arranged as described with reference to FIG. 4. In one such example, process 704 is executed.

At block 702, the plurality of crossbar circuits 301 are arranged in a diagonal relative to edges of Router 101. At block 703, interconnects (302x and 302y) of multiple ports (East, West, South, North) are arranged sequentially. For example, the shaded and black horizontal lines 0 to 111 described with reference to FIG. 4 of the multiple ports are arranged sequentially. Referring back to FIG. 7, at block 704, the plurality of crossbar circuits 301 are arranged such that the data bits of the multiple ports are arranged sequentially in one direction and arrange in strides of a number of data bits in another direction. For example, data bits are arranged sequentially in the y-direction and arranged with a stride of 16 in the x-direction as described with reference to FIG. 4. Referring back to FIG. 7, at block 704, signals are routed over interconnects 302x/y and multiplexers of crossbar circuits 301 are selected to route the signals from one port to another port.

Table 1 illustrates the technical effects of some embodiments relative to transitional designs.

TABLE 1

Performance scaling comparison assuming total interconnect length between routers is unchanged.

| | Some Embodiments | | Traditional Design (e.g., FIG. 2) | |
| --- | --- | --- | --- | --- |
| For crossbar interconnect scaling with respect to: | Bus Width (d) | Number pf Ports (p) | Bus Width (d) | Number of Ports (p) |
| Latency per bit | Constant | Constant | $d^2$ | $p^2$ |
| Power per bit per port | Constant | Constant | d | p |
| Crossbar Power | D | p | $d^2$ | $p^2$ |

Compared to a traditional design (such as the one described with reference to FIG. 2), the latency per bit for some embodiments scales by a constant amount (e.g., linearly) with 'd' and 'p,' while the latency per bit for the traditional design scales by $d^2$ and $p^2$. Compared to the traditional design, power per bit per port for some embodiments scales by a constant amount (e.g., linearly) with 'd' and 'p,' while the power per bit per port for the traditional design scales by 'd.' and 'p' with number of 'd' and 'p,' respectively. Compared to the traditional design, crossbar power for some embodiments scales by 'd' and 'p' with number of 'd' and 'p,' respectively, while the crossbar power for the traditional design scales by $d^2$ and $p^2$ with number of 'd' and 'p,' respectively.

Figure 8:
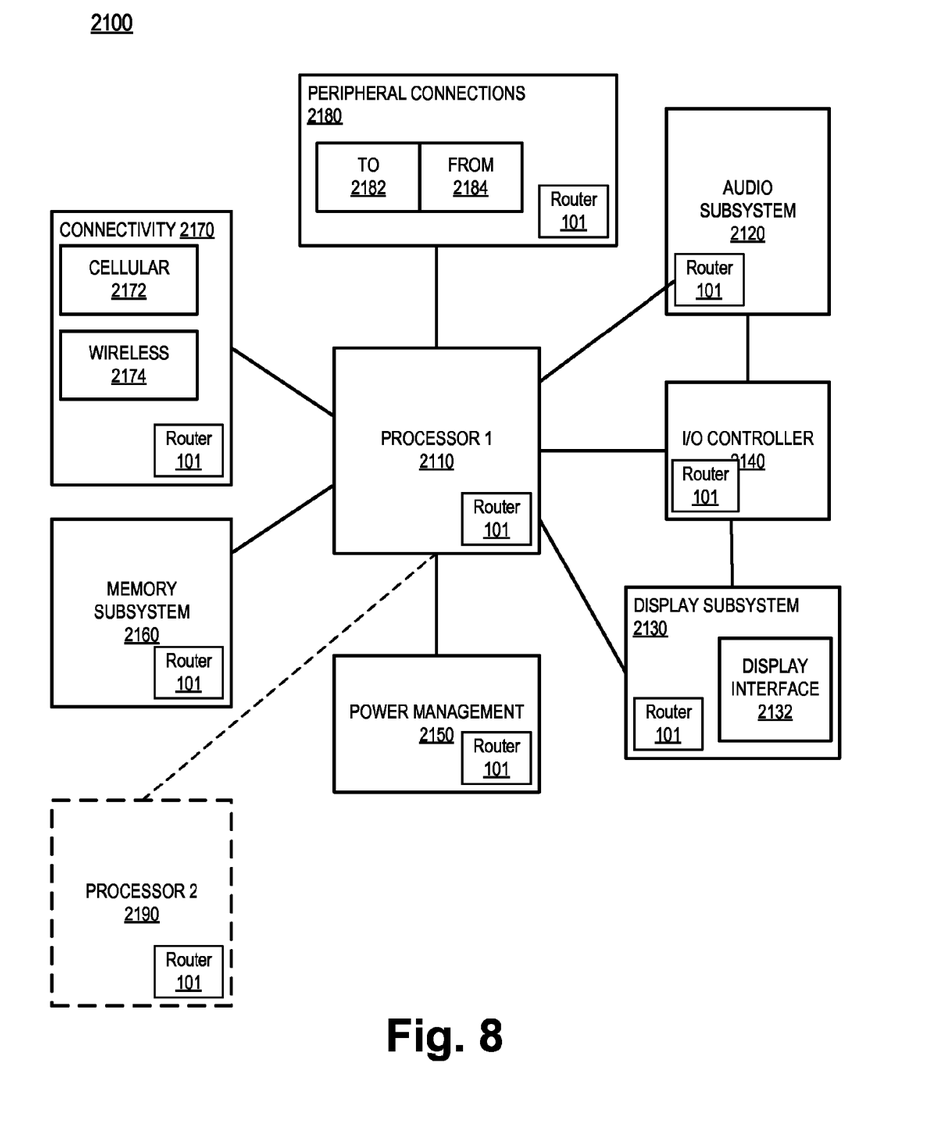
FIG. 8 illustrates a smart device or a computer system or a SoC (System-on-Chip) with a NoC having a scalable crossbar floorplan, according to some embodiments.

FIG. 8 illustrates a smart device or a computer system or a SoC (System-on-Chip) 2100 with NoC 100 having Router 101 with crossbar circuits 301 arranged in a scalable floorplan, according to some embodiments of the disclosure. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with Routers 101 having scalable floorplans, according to some embodiments discussed. Other blocks of the computing device 2100 may also include Routers 101 having scalable floorplan, according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110. In some embodiments, audio subsystem 2120 includes Routers 101 having scalable floorplans, according to some embodiments.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user. In some embodiments, display subsystem 2130 includes Routers 101 having scalable floorplans, according to some embodiments.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices. In some embodiments, I/O controller 2140 includes Routers 101 having scalable floorplans, according to some embodiments.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. In some embodiments, power management 2150 includes crossbar circuits 102 with scalable floorplan, according to some embodiments. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In some embodiments, memory subsystem 2160 includes Routers 101 having scalable floorplan, according to some embodiments.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices. In some embodiments, connectivity 2170 includes Routers 101 having scalable floorplan, according to some embodiments.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems. In some embodiments, peripheral connections 2180 2120 includes Routers 101 having scalable floorplan, according to some embodiments.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: multiple ports; and a plurality of crossbar circuits arranged such that at least one crossbar circuit receives all interconnects associated with a data bit of the multiple ports and is operable to re-route signals on those interconnects. In some embodiments, circuits associated with the at least one crossbar circuit are located in one location. In some embodiments, the plurality of crossbar circuits are arranged in a diagonal relative to edges of the apparatus. In some embodiments, the interconnects of the multiple ports are arranged sequentially along the edges.

In some embodiments, the plurality of crossbar circuits are arranged such that data bits of the multiple ports are arranged sequentially in one direction and arranged in strides of a number of data bits in another direction. In some embodiments, the at least one crossbar circuit comprises one or more multiplexers, and wherein the one or more multiplexers are arranged such that signals on interconnects extending in the x-direction are routed before signals on interconnects extending in the y-direction. In some embodiments, the at least one crossbar circuit comprises one or more multiplexers, and wherein the one or more multiplexers are fully connected.

In some embodiments, at least two of the crossbar circuits of the plurality of crossbar circuits are 1-bit crossbar circuits, wherein each of the 1-bit crossbar circuit has a plurality of multiplexers, and wherein at least one multiplexer of the plurality of multiplexers in the at least two crossbar circuits shares a same select bus. In some embodiments, the multiple ports include ports for communicating with other routers and a port for communicating with logic in proximity to the apparatus.

In another example, an SoC is provided which comprises: a plurality of processing elements; and a network-on-chip (NoC) having at least one router that is operable to allow a first processing element of the plurality of processing elements to communicate with a second processing element of the plurality of processing elements, wherein the router comprises: multiple ports; and a plurality of crossbar circuits arranged such that at least one crossbar circuit receives all interconnects associated with a data bit of the multiple ports and is operable to re-route signals on those interconnects.

In some embodiments, the multiple ports include ports for communicating with other routers in the NoC and a port for communicating with logic in proximity to the first or second processing elements. In some embodiments, the NoC includes routers which are arranged on one or more dies separate from a die having some of the plurality of processing elements. In some embodiments, at least one processing element of the plurality has an associated router of the NoC.

In some embodiments, circuits associated with the at least one crossbar circuit are located in one location. In some embodiments, the plurality of crossbar circuits are arranged in a diagonal relative to edges of the router. In some embodiments, the interconnects of the multiple ports are arranged sequentially along the edges. In some embodiments, the plurality of crossbar circuits are arranged such that data bits of the multiple ports are arranged sequentially in one direction and arranged in strides of a number of data bits in another direction.

In another example, a method is provided which comprises: arranging a plurality of crossbar circuits such that at least one crossbar circuit receives all interconnects associated with a data bit of multiple ports; and selectively routing signals on those interconnects. In some embodiments, arranging the plurality of crossbar circuits comprises: arranging the plurality of crossbar circuits in a diagonal relative to edges of an apparatus; and arranging the interconnects of the multiple ports sequentially along the edges. In some embodiments, arranging the plurality of crossbar circuits comprises: arranging the plurality of crossbar circuits such that data bits of the multiple ports are arranged sequentially in one direction and arranged in strides of a number of data bits in another direction.

In another example, an apparatus is provided which comprises: means for arranging a plurality of crossbar circuits such that at least one crossbar circuit receives all interconnects associated with a data bit of multiple ports; and means for selectively routing signals on those interconnects. In some embodiments, the means for arranging the plurality of crossbar circuits comprises: means for arranging the plurality of crossbar circuits in a diagonal relative to edges of an apparatus; and means for arranging the interconnects of the multiple ports sequentially along the edges.

In some embodiments, the means for arranging the plurality of crossbar circuits comprises: means for arranging the plurality of crossbar circuits such that data bits of the multiple ports are arranged sequentially in one direction and arranged in strides of a number of data bits in another direction. In some embodiments, means associated with the at least one crossbar circuit are located in one location. In some embodiments, the at least one crossbar circuit comprises one or more multiplexing means, and wherein the one or more multiplexing means are arranged such that signals on interconnects extending in the x-direction are routed before signals on interconnects extending in the y-direction.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   multiple ports; and
   a plurality of crossbar circuits arranged such that at least one crossbar circuit receives all interconnects associated with a data bit of the multiple ports and is operable to re-route signals on those interconnects,
   wherein all the plurality of crossbar circuits are arranged in a diagonal relative to edges of the apparatus.

2. The apparatus of claim 1, wherein circuits associated with the at least one crossbar circuit are located in one location.

3. The apparatus of claim 1, wherein the interconnects of the multiple ports are arranged sequentially along the edges.

4. The apparatus of claim 1, wherein the plurality of crossbar circuits are arranged such that data bits of the multiple ports are arranged sequentially in one direction and arranged in strides of a number of data bits in another direction.

5. The apparatus of claim 1, wherein the at least one crossbar circuit comprises one or more multiplexers, and wherein the one or more multiplexers are arranged such that signals on interconnects extending in the x-direction are routed before signals on interconnects extending in the y-direction.

6. The apparatus of claim 1, wherein the at least one crossbar circuit comprises one or more multiplexers, and wherein the one or more multiplexers are fully connected.

7. The apparatus of claim 1, wherein at least two of the crossbar circuits of the plurality of crossbar circuits are 1-bit crossbar circuits, wherein each of the 1-bit crossbar circuit has a plurality of multiplexers, and wherein at least one multiplexer of the plurality of multiplexers in the at least two crossbar circuits shares a same select bus.

8. The apparatus of claim 1, wherein the multiple ports include ports for communicating with other routers and a port for communicating with logic in proximity to the apparatus.

9. A system on chip (SoC) comprising:
   a plurality of processing elements; and
   a network-on-chip (NoC) having at least one router that is operable to allow a first processing element of the plurality of processing elements to communicate with a second processing element of the plurality of processing elements, wherein the router comprises:
   multiple ports; and
   a plurality of crossbar circuits arranged such that at least one crossbar circuit receives all interconnects associated with a data bit of the multiple ports and is operable to re-route signals on those interconnects,
   wherein all the plurality of crossbar circuits are arranged in a diagonal relative to edges of the apparatus.

10. The SoC of claim 9, wherein the multiple ports include ports for communicating with other routers in the NoC and a port for communicating with logic in proximity to the first or second processing elements.

11. The SoC of claim 9, wherein the NoC includes routers which are arranged on one or more dies separate from a die having some of the plurality of processing elements.

12. The SoC of claim 9, wherein at least one processing element of the plurality has an associated router of the NoC.

13. The SoC of claim 9, wherein circuits associated with the at least one crossbar circuit are located in one location.

14. The SoC of claim 9, wherein the interconnects of the multiple ports are arranged sequentially along the edges.

15. The SoC of claim 9, wherein the plurality of crossbar circuits are arranged such that data bits of the multiple ports are arranged sequentially in one direction and arranged in strides of a number of data bits in another direction.

16. A method comprising:
   arranging a plurality of crossbar circuits such that at least one crossbar circuit receives all interconnects associated with a data bit of multiple ports;
   selectively routing signals on those interconnects; and
   arranging all the plurality of crossbar circuits in a diagonal relative to edges of an apparatus.

17. The method of claim 16, wherein arranging the plurality of crossbar circuits comprises:
   arranging the interconnects of the multiple ports sequentially along the edges.

18. The method of claim 16, wherein arranging the plurality of crossbar circuits comprises:
   arranging the plurality of crossbar circuits such that data bits of the multiple ports are arranged sequentially in one direction and arranged in strides of a number of data bits in another direction.

* * * * *